(12) United States Patent
Higashiguchi et al.

(10) Patent No.: US 7,473,852 B2
(45) Date of Patent: Jan. 6, 2009

(54) PRINTED-CIRCUIT BOARD AND CIRCUIT UNIT INCORPORATING THE CIRCUIT BOARD

(75) Inventors: Masahiro Higashiguchi, Hyogo-ken (JP); Kunihiro Tan, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 300 days.

(21) Appl. No.: 11/239,353

(22) Filed: Sep. 30, 2005

(65) Prior Publication Data

US 2006/0154533 A1 Jul. 13, 2006

(30) Foreign Application Priority Data

Sep. 30, 2004 (JP) .............................. 2004-286631

(51) Int. Cl.
*H05K 1/16* (2006.01)
(52) U.S. Cl. ...................................... 174/260; 174/261
(58) Field of Classification Search ................ 174/260, 174/261; 257/787
See application file for complete search history.

(56) References Cited

U.S. PATENT DOCUMENTS

| | | | | |
|---|---|---|---|---|
| 5,535,101 A | * | 7/1996 | Miles et al. ................. | 361/808 |
| 5,925,445 A | * | 7/1999 | Suzuki ........................ | 428/209 |
| 6,297,553 B1 | * | 10/2001 | Horiuchi et al. ............. | 257/737 |
| 6,515,361 B2 | * | 2/2003 | Lee et al. ..................... | 257/738 |
| 6,984,545 B2 | * | 1/2006 | Grigg et al. ................. | 438/118 |
| 2004/0040742 A1 | * | 3/2004 | Ishizaki ....................... | 174/257 |

FOREIGN PATENT DOCUMENTS

| | | |
|---|---|---|
| JP | 8-111477 | 4/1996 |
| JP | 9-205164 | 8/1997 |
| JP | 2002-076191 | 3/2002 |

* cited by examiner

*Primary Examiner*—Ishwar (I. B.) Patel
(74) *Attorney, Agent, or Firm*—Dickstein Shapiro LLP

(57) ABSTRACT

A printed-circuit board and a circuit unit incorporating the circuit board. The printed-circuit board capable of achieving a suitable contact area of sealing resin includes a metal circuit pattern formed on a substrate, a plurality of mounting electrodes formed on the substrate for electrically connecting at least one electronic component, a resist layer of electrically insulating material disposed over the surface of the substrate having openings in the regions corresponding to the plurality of mounting electrodes, and plurality of external connecting terminals provided on edge portions of the substrate for connecting external devices. The resist layer is preferably formed only on the area surrounding the plurality of mounting electrodes inside a sealing region, the sealing region being resin sealed over the surface of the substrate. A circuit unit is also disclosed, including an electronic device and the above-mentioned printed-circuit board.

10 Claims, 4 Drawing Sheets

PRINTED-CIRCUIT BOARD AND CIRCUIT UNIT INCORPORATING THE CIRCUIT BOARD

This document claims priority to Japanese Patent Application No. 2004-286631, filed with the Japanese Patent Office on Sep. 30, 2004, the entire contents of which are hereby incorporated by reference.

FIELD OF THE INVENTION

The patent invention generally relates to printed-circuit boards, and more particularly to a printed-circuit board for mounting on a substrate at least an electronic device and connecting terminals, and a circuit unit incorporating the printed-circuit board provided with resin sealing.

BACKGROUND OF THE INVENTION

The miniaturization of recent electronic circuitry has rapidly become widespread and this trend is apparent in electronic apparatuses, particularly in portable devices.

Miniaturization has an effect on various aspects of electronic device fabrication such as, for example, the size of rechargeable batteries used in the portable devices and charging control circuitries for the batteries for housing in battery packs.

The charging control circuitry is preferably devised, therefore, to be able to mount chip-type electronic components including a semiconductor device on a printed-circuit board, which can be as small as several millimeters. The printed-circuit board is then provided with prescribed resin sealing to achieve necessary mechanical strength and reliability.

FIGS. 4A and 4B are drawings diagrammatically illustrating a known printed-circuit board, in which FIG. 4A is a plan view of the circuit board, while FIG. 4B is a cross-sectional view taken along line VV of the structure of FIG. 4A.

Referring to FIGS. 4A and 4B, the printed-circuit board is capable of mounting at least one electronic component including a semiconductor device, having external connecting electrodes on a bottom face.

On a circuit board substrate 32, a circuit pattern 36 of copper film is formed. Soldering lands 34 are also formed as electrode portions for making electrical connections to the external connecting electrodes of the mounted electronic component. A solder resist film (or insulating materials layer) 38 is formed over the entire surface of the structure so as to have openings in the regions corresponding to the specific locations of the soldering lands 34.

The solder resist film 38 is formed herein for preventing solder, used for electrically connecting the electronic components, from unduly spreading out onto neighboring soldering lands or circuit patterns 36, possibly causing short circuiting. The solder resist film 38 also serves to protect, and prevent the deterioration of, the circuit pattern 36 previously formed.

In the abovementioned structure, with the printed-circuit board mounted with electronic components and sealed with sealant resin, adhesive strength between solder resist film 38 and the sealing resin is smaller than the strength between the substrate 32 and the resin, and the mechanical strength of solder resist film 38 itself is not satisfactory. This may give rise to the separation or peeling of the sealing resin from solder resist film 38, or to the cracking of the film 38 within.

Peeling of the sealant resin from the substrate of circuit board can give rise to several adverse effects, such as moisture permeating into the interior and deterioration of the reliability of the device.

In order to alleviate such difficulties, a method, in which the solder resist film 38 is provided with a number of circular or hexagonal-shaped openings 40 at least 0.5 millimeter apart from each other, is illustrated in FIGS. 5A and 5B. The sealant resin is brought into direct contact with the substrate to a greater degree and adhesive strength increases between the sealant resin and the substrate (for example, Japanese Laid-Open Patent Application No. 9-205164).

In the method of the abovementioned '164 application, however, it is hard for such a small circuit board substrate to accommodate many openings 40 so as to mount a plurality of chip-type electronic components.

Further, it is difficult to provide the openings 40 of the number large enough to achieve satisfactory adhesive strength between the sealant resin and the substrate.

Another method has also been disclosed, in which a sealant resin pattern is formed directly on a circuit board substrate without interposing a solder resist pattern (Japanese Laid-Open Patent Application No. 8-111477).

In this method, either no solder resist pattern is formed at all, or a pattern is formed and subsequently removed prior to resin sealing.

In the case of the '477 application, several drawbacks arise, including frequent short-circuiting caused by the formation of solder bridges during the steps of printing cream solder for soldering electronic components. Additionally, an increase in production costs results from appending a process step for removing solder resist following the soldering.

It is therefore desirable to overcome the abovementioned difficulties and achieve satisfactory adhesive strength between the sealant resin and the substrate even with interposing a solder resist layer therebetween.

SUMMARY

Accordingly, it is an object of the present invention to provide a printed-circuit board, having most, if not all, of the advantages and features of similar employed apparatuses, while eliminating many of the aforementioned disadvantages.

It is another object to provide a printed-circuit board capable of achieving a suitable contact area between sealing resin and a substrate of the printed-circuit board so that the adhesive strength therebetween can increase.

The following description is a synopsis of only selected features and attributes of the present disclosure. A more complete description thereof is found below in the section entitled

DESCRIPTION OF THE PREFERRED EMBODIMENTS

A printed-circuit board according to an exemplary embodiment includes a substrate, a metal circuit pattern formed on the substrate, a plurality of mounting electrodes formed on the substrate for electrically connecting at least one electronic component, a resist layer of electrically insulating material formed over the surface of the substrate having openings in the regions corresponding to the plurality of mounting electrodes, and a plurality of external connecting terminals provided on edge portions of the substrate for connecting external devices, in which the resist layer is formed solely on the area surrounding the plurality of mounting electrodes inside a sealing region for use in resin sealing over the surface of the substrate.

In addition, the resist layer may be formed to frame an outer edge of the sealing region, and an area around the sealing region and except a predetermined portion to be exposed, in which the predetermined portion includes at least the areas for placing the plurality of external connecting terminals.

A circuit unit is also disclosed, including an electronic device and the printed-circuit board described above, in which the electronic device is mounted on the printed-circuit board and electrically connected to the plurality of mounting electrodes. At least one area mounting the electronic device is resin sealed.

A suitable area of contact between sealing resin and the printed-circuit board and increased adhesive strength therebetween are achieved by the present printed-circuit board. As a result, the circuit unit can achieve excellent device reliability and high production yield.

The present disclosure and features and advantages thereof will be more readily apparent from the following detailed description and appended claims when taken with drawings.

DESCRIPTION OF THE PREFERRED EMBODIMENTS

Figure 1A:
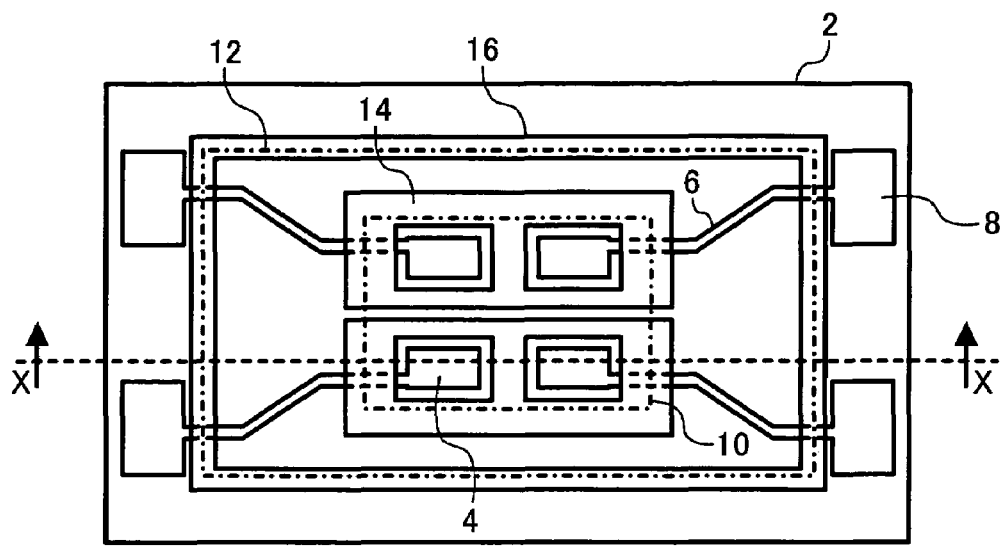
FIG. 1A is a plan view diagrammatically illustrating a printed-circuit board according to one embodiment disclosed herein.

In the detailed description which follows, specific embodiments of a printed-circuit board and a circuit unit are described. These embodiments are particularly useful for increasing adhesive strength between sealing resin and a substrate of the printed-circuit board, and for improving device reliability.

It is understood, however, that the present disclosure is not limited to these embodiments. For example, the basic construction of the printed-circuit board and circuit unit disclosed herein may also be adaptable to any form of circuit unit. Other embodiments will be apparent to those skilled in the art upon reading the following description.

According to a general example in the present disclosure, a printed-circuit board capable of achieving a suitable contact area of sealing resin may include a substrate, a metal circuit pattern, a plurality of mounting electrodes, a resist layer, and a plurality of external connecting terminals.

The metal circuit pattern is formed on the substrate, the plurality of mounting electrodes are formed on the substrate for electrically connecting at least one electronic component, the resist layer of electrically insulating material is formed over the surface of the substrate having openings in the regions corresponding to the plurality of mounting electrodes, and the plurality of external connecting terminals are provided on edge portions of the substrate for connecting external devices.

In one embodiment of the invention, the resist layer is preferably formed only on the area surrounding the plurality of mounting electrodes inside a sealing region for use in resin sealing over the surface of the substrate.

The term, "the area surrounding the plurality of mounting electrodes" is meant to describe an area of sufficient size that the resist layer can be prevented from electrical contact between neighboring mounting electrodes. In order to increase the area of contact between sealing resin and the substrate of the printed-circuit board, it is preferable that the space utilized for the resist layer formed surrounding the plurality of mounting electrodes be as small as possible.

In another embodiment, the resist layer is formed only on the area surrounding the plurality of mounting electrodes inside a sealing region used for resin sealing over the surface of the substrate so as to frame an outer edge of the sealing region.

By disposing the resist layer framing the outer edge of the sealing region, the sealing resin for the sealing can be prevented from unduly spreading out beyond the region framed by the resist layer and the resin sealing can be provided within the region according to a predetermined and specific design for resin sealing.

In still another embodiment, the resist layer is formed only on the area surrounding the plurality of mounting electrodes inside a sealing region used for resin sealing over the surface of the substrate, so as to frame an outer edge of the sealing region, and to cover the area framing the sealing region and except a predetermined portion to be exposed. The predetermined portion includes at least one area for placing the plurality of external connecting terminals.

The term "predetermined portion to be exposed" may include any terminal for electrically connecting an outside electronic component including, for example, but not limited to the aforementioned plurality of mounting electrodes and electrode portions for connecting circuit elements exemplified by a capacitor and a resistor.

Since the region on the substrate outside the sealing region is made to be encapsulated by the resist layer except the abovementioned predetermined portion to be exposed, circuitry and electrode portions without resin sealing can be protected from deterioration.

As a result of the disposition of the present resist layer mentioned above, a printed-circuit board is provided. The resist layer is capable of achieving a suitable contact area between sealing resin and a substrate of the printed-circuit board, and the adhesive strength therebetween can increase.

In another embodiment, a circuit unit is also disclosed, including an electronic device and any one of the printed-circuit boards described above, in which the electronic device is mounted on the printed-circuit board by electrical connection to the plurality of mounting electrodes. At least one area mounting the electronic device may be resin sealed.

As a result of increased area of contact between sealing resin and the printed-circuit board, adhesive strength for the sealing resin can increase also for the circuit unit. Therefore, by incorporating the printed-circuit boards mentioned earlier, circuit units can be formed with excellent device reliability and high production yield.

Having described the present invention in general, the following examples are provided further to illustrate preferred embodiments of the invention. It is understood that these embodiments are intended to be illustrative only but not limiting in the present invention.

A printed-circuit board will be described herein below according to one embodiment disclosed herein.

Figure 1B:
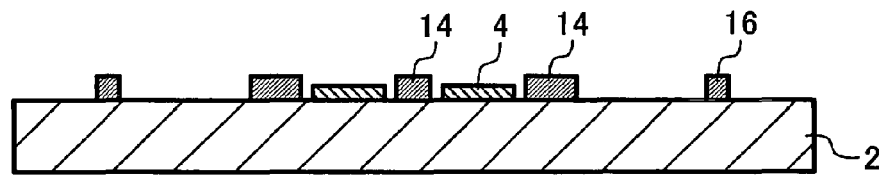
FIG. 1B is a cross-sectional view taken along the line XX of the structure of FIG. 1A.
Figure 1C:
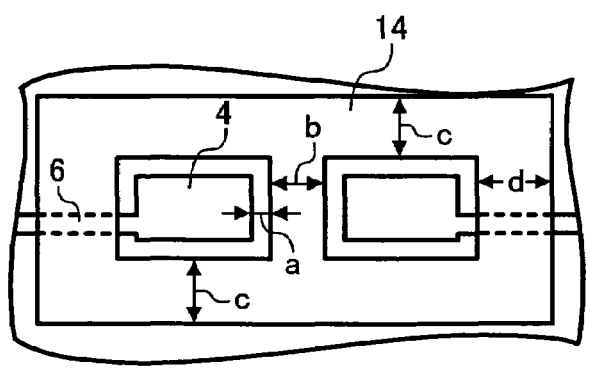
FIG. 1C is an enlarged view of the portion of solder lands including the vicinity thereof.

FIGS. 1A through 1C are drawings diagrammatically illustrating a printed-circuit board, in which FIG. 1A is a plan view of the printed-circuit board, FIG. 1B a cross-sectional view taken along the line XX of the structure of FIG. 1A, and FIG. 1C an enlarged view of the portion of solder lands including the vicinity thereof.

Referring to FIGS. 1A and 1B, the printed-circuit board includes a substrate 2 made of a insulating material such as, for example, glass epoxy, and a mounting region 10 formed thereon for mounting at least one electronic component.

On four locations of the mounting region 10, each of four solder lands (mounting electrode portions) 4 is provided for electrically connecting the electronic component to be mounted. In addition, each of four external connecting terminals 8 is provided on an edge portion of the substrate 2 for connecting external devices.

The external connecting terminals 8 are electrically connected respectively to the solder lands 4 by way of circuit patterns 6.

The solder lands 4, circuit patterns 6, and external connecting terminals 8 are formed by patterning an electroconductive material such as, for example, thin copper film.

A first solder resist film 14 is formed as a layer of insulating material over the area surrounding soldering lands 4 retaining a predetermined space therebetween for preventing solder, which is used for soldering the electronic components, from unduly spreading out onto neighboring soldering lands 4 or circuit patterns 6, possibly causing short circuiting.

A second solder resist film 16 is additionally formed, framing the region 12 over which resin sealing is provided (hereinafter referred to as sealing region 12), following the mounting of an electronic component.

The spacing "a" shown in FIG. 1C between the soldering land 4 and solder resist film 14 is determined with consideration for thermal expansion of the solder resist film 14 in use for mounting the electronic component such that solder placed on the solder lands 4 is moderately pressed against the solder resist film 14 through the thermal expansion. The spacing "a" in the present embodiment is approximately 60 µm.

As also shown in FIG. 1C, it is necessary for the distance "b" of solder resist film 14 between neighboring soldering lands 4 to be determined such that undue electrical contact is avoided between solder, which is placed on the solder lands 4, and either neighboring electrodes or nearby portions of circuit pattern 6. The distance "b" in the present embodiment is between approximately 100 and 200 µm.

In addition, the width of the second solder resist film 16, which is formed in frame-shaped outlining the sealing region 12, is in the range of approximately 30 to 50 µm in this embodiment.

Incidentally, it may be added that the abovementioned size of the solder resist films 14, 16 has been shown for purposes of illustration, and it may vary depending on the size of the substrate 2, and the dimensions and number of electronic components to be mounted.

In addition, as shown in FIGS. 1A and 1B, the portions of circuit pattern 6 are exposed above the surface of substrate 2 at the portions over which none of the solder resist film 14 is formed.

It may be noted, however, this exposure prior to the mounting will not matter for the device process since the inside of the sealing region 12 is subjected to resin sealing after the mounting.

As described above in the present embodiment, the solder resist films 14 are formed inside the sealing region 12 only over the area surrounding soldering lands 4. As a result, the area of contact formed by sealing between the sealing resin and the substrate 2 can increase, and this results in the increase in the adhesive strength therebetween.

In addition, since the solder resist film 16 is formed so as to frame the outline of the sealing region 12, the sealing resin can be prevented from unduly spreading out beyond the sealing region 12 during the resin sealing.

While the solder resist film 16 is formed so as to frame the outline of the sealing region 12, this is not intended to limit the invention to this embodiment. Other types of printed-circuit board may be used without forming the solder resist film 16, for example.

A variety of other embodiments of the present invention may also be applied to other circuit boards. Other circuit boards include, for example, a printed-circuit board capable of mounting plural electronic components, and provided with electrode portions for connecting an external device on the reverse side of the substrate 2 by way of through-holes additionally provided in the substrate 2. A circuit board may also be provided with a soldering land 4, circuit pattern 6, and external connecting terminals 8, each formed of metal other than cupper such as gold, for example.

A further embodiment will be described herein with respect to FIGS. 2A and 2B.

Figure 2A:
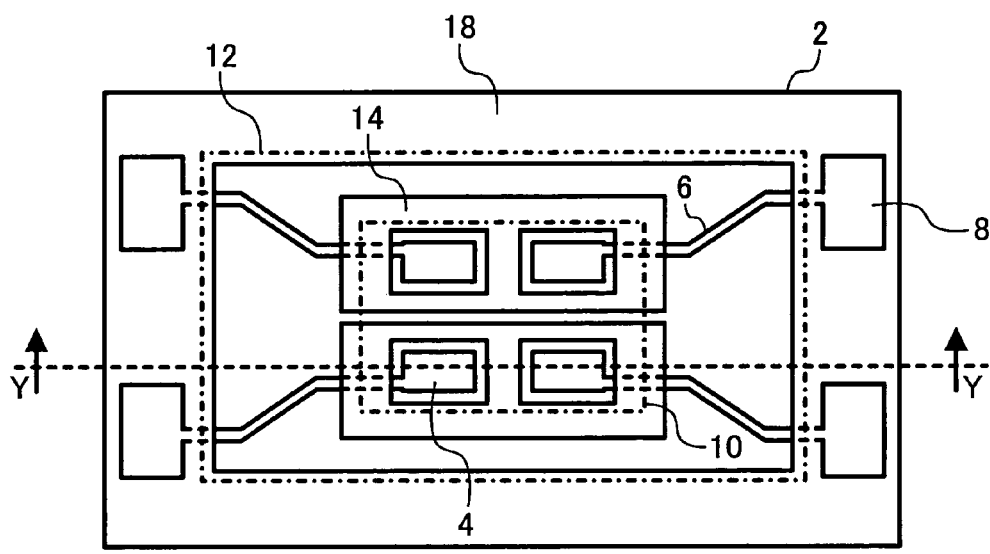
FIG. 2A is a plan view diagrammatically illustrating a printed-circuit board according to another embodiment disclosed herein.
Figure 2B:
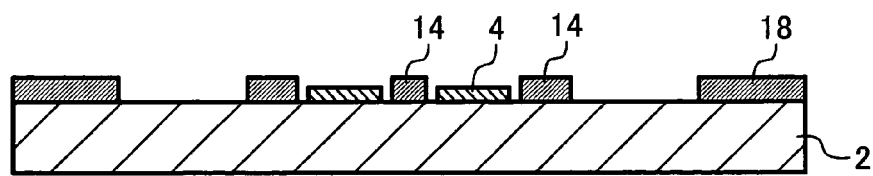
FIG. 2B is a cross-sectional view taken along the line YY of the structure of FIG. 2A.

FIGS. 2A and 2B are drawings diagrammatically illustrating a printed-circuit board, in which FIG. 2A is a plan view of the printed-circuit board, and FIG. 2B a cross-sectional view taken along the line YY of the structure of FIG. 2A.

The components of FIGS. 2A and 2B that are similar to those of FIGS. 1A and 1B are shown with identical numerical representations. The detailed description thereof is herein abbreviated.

Referring to FIGS. 2A and 2B, the printed-circuit board includes solder lands 4, circuit patterns 6, and external connecting terminals 8, each formed on a substrate 2.

A solder resist film 14 is formed on the substrate 2 over the area surrounding soldering lands 4. A solder resist film 18 is formed as a layer of insulating material outside the sealing region 12. The solder resist film 18 has four openings at the locations respectively corresponding to four external connecting terminals 8.

Since the portions of circuit pattern 6, which are formed outside the sealing region, are encapsulated and protected by the solder resist film 18 as shown in FIGS. 2A and 2B, the deterioration in device characteristics can be obviated.

FIGS. 2A and 2B also show that the first solder resist films 14 are formed inside of the sealing region 12 only over the area surrounding soldering lands 4.

As a result, the area of contact formed by sealing between the sealing resin and the substrate 2 may increase, thus increasing the adhesive strength therebetween.

Moreover, since a second solder resist film 18 is provided over the boundary portions of sealing region 12 so as to form a step between the inside and outside of the region 12, undue spread of sealing resin outside of the region 12 can be prevented.

As a further embodiment, a circuit unit according to the present invention is now described with reference to FIGS. 3A-3C.

Figure 3A:
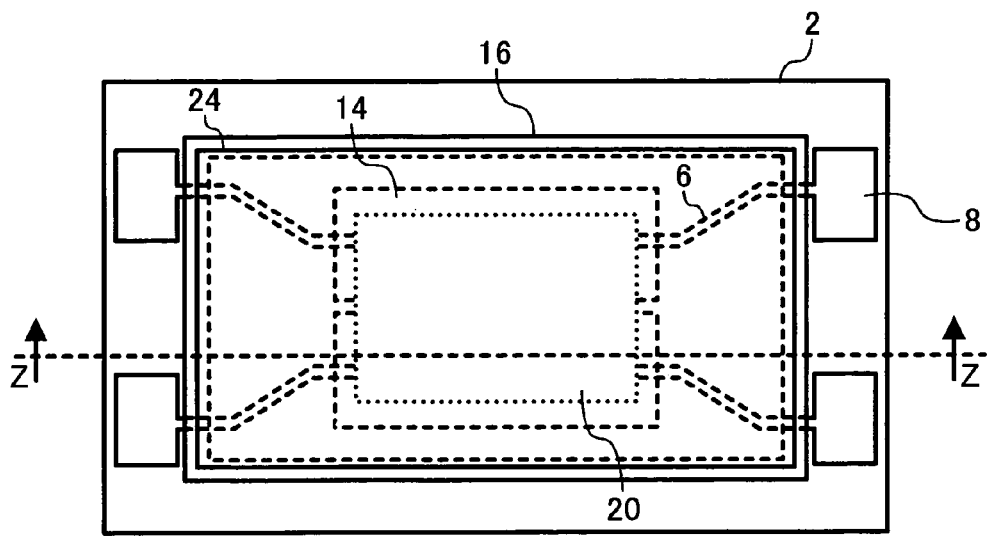
FIG. 3A is a plan view diagrammatically illustrating a circuit unit according to still another embodiment disclosed herein.
Figure 3B:
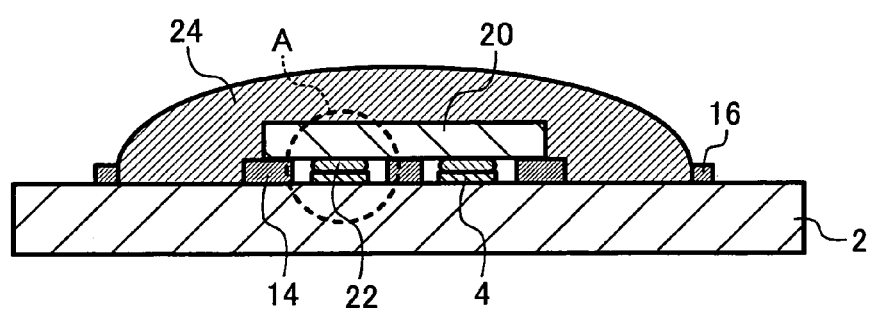
FIG. 3B is a cross-sectional view taken along the line ZZ of the structure of FIG. 3A.
Figure 3C:
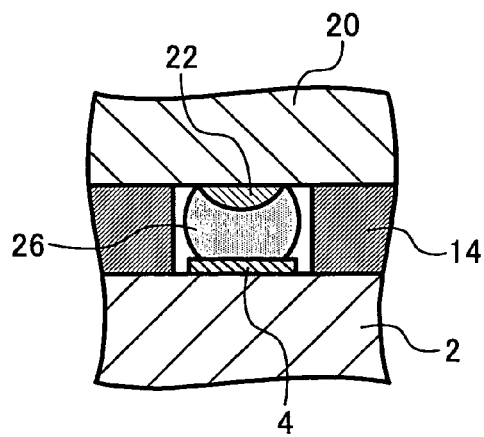
FIG. 3C is an enlarged view of the portion "A" enclosed by a dotted circle of FIG. 3B.
Figure 4A:
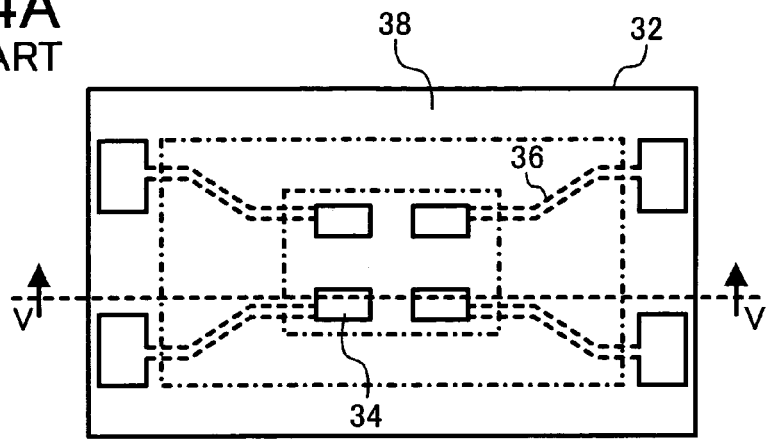
FIG. 4A is a plan view diagrammatically illustrating a known printed-circuit board.
Figure 4B:
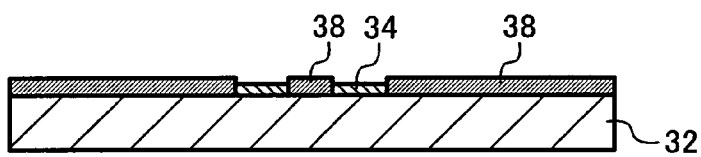
FIG. 4B is a cross-sectional view taken along the line VV of the structure of FIG. 4A.
Figure 5A:
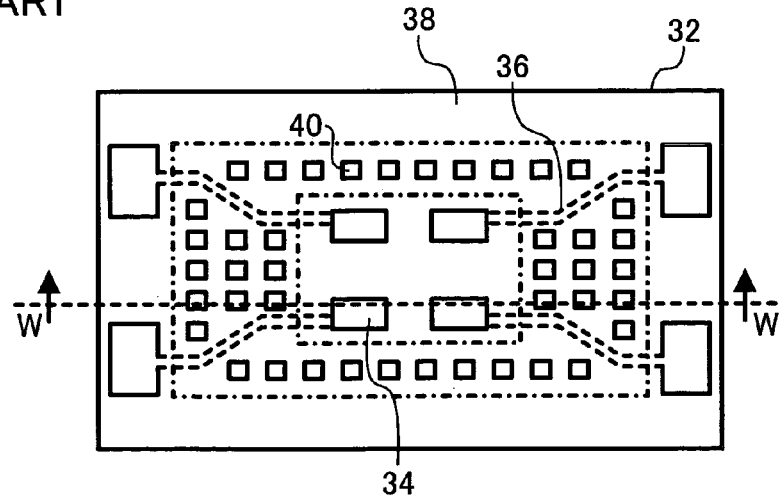
FIG. 5A is a plan view diagrammatically illustrating another known printed-circuit board.
Figure 5B:
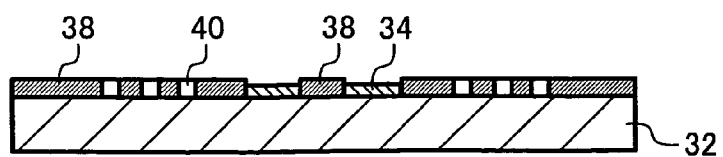
FIG. 5B is a cross-sectional view taken along the line WW of the structure of FIG. 5A.

FIGS. 3A through 3C are drawings diagrammatically illustrating a circuit unit. FIG. 3A is a plan view of the circuit unit, FIG. 3B a cross-sectional view taken along the line ZZ of the structure of FIG. 3A, and FIG. 3C an enlarged view of the portion "A" enclosed by a dotted circle of FIG. 3B.

It may be noted that the printed-circuit board mentioned earlier in the first embodiment is incorporated into the present circuit unit.

In the circuit unit according to FIGS. 3A and 3B, a flip-chip type semiconductor device 20 is mounted in a mounting region 10 (FIG. 1A) and resin sealing is provided over the structure with sealing resin 24 in a sealing region 12 (FIG. 1A).

Referring to FIG. 3C, the semiconductor device 20, which is provided with terminals for external connection 22 on the bottom face thereof, is electrically connected by way of soldering lands 4 and solder 26.

On the area surrounding soldering lands 4 on the circuit board, the solder resist film 14 is formed such that the solder can be prevented from being unduly dispersed or extended past the surrounding area during soldering of the terminals 22 onto soldering land 4.

In addition, since the solder resist film 14 is formed so as to push the solder 26 through thermal expansion towards the center of the soldering land 4, reliable electrical connection can be achieved between the terminals 22 and soldering land 4.

Resin sealing is performed using liquid sealing resin 24 by first potting and subsequently hardening through either UV (ultraviolet) light irradiation or through retention of the resin at relatively high temperatures.

In order to achieve the miniaturization of the circuit unit, the height of the sealing resin is preferably small after resin sealing. It is therefore preferable for the material for the liquid sealing resin 24 to have a low viscosity.

A liquid sealing resin material 24 having too low of a viscosity, however, may result in the resin material 24 being unduly spread past a predetermined sealing region during pouring of the material. This problem can be obviated by forming a frame-shaped solder resist film 16 outlining the sealing region 12 so that the sealing resin 24 is contained within the predetermined region.

Therefore, the sealing resin 24 can be formed being confined within a region as small as possible, achieving miniaturization of the circuit unit.

Examples of suitable materials for the sealing resin 24 include liquid resin materials of either the silicon or acrylic series.

In addition, since the solder resist films 14 are formed inside of the sealing region 12 only over the area surrounding soldering lands 4, the portions other than the abovementioned solder resist films 14 and the circuit pattern 6 are exposed and brought into direct contact with the sealing resin 24.

As described earlier, the adhesive strength between solder resist film and the sealing resin 24 is smaller than the strength between the substrate 2 and the resin. Therefore, by increasing the area of the direct contact between the substrate 2 and the sealing resin 24, the adhesive strength therebetween is increased.

While a flip-chip type semiconductor device 20, which is provided with terminals for external connection 22 on the bottom face thereof, is mounted on the present circuit board in the circuit unit of the present embodiment, this is not intended to limit the invention to the embodiment.

Additionally, other types of electrical connection may be adopted, such as, for example, the use of bonding wires for connecting electrode portions of the electronic component to be mounted to the printed-circuit board. In addition, the circuit board may alternatively be capable of mounting a plurality of components.

The printed-circuit board and circuit unit of the present invention have several advantages, as is apparent from the above description.

For example, the resist layer in the printed-circuit board is preferably formed only on the area surrounding the plurality of mounting electrodes inside a sealing region for use in resin sealing over the surface of the substrate.

As a result, the present printed-circuit board is capable of achieving a suitable contact area between the sealing resin and the substrate of the board, and the adhesive strength therebetween can increase.

In addition, the resist layer may be formed in the present printed-circuit board so as to frame an outer edge of the sealing region. Thus, the sealing resin for the sealing can be prevented from unduly spreading out beyond the region framed by the resist layer, and the resin sealing can be provided within the region according to a predetermined and specific design for resin sealing.

Additionally, since the region on the substrate outside the sealing region is encapsulated by the resist layer except the abovementioned predetermined portion to be exposed, circuitry and electrode portions without resin sealing can be protected from deterioration.

In another embodiment, a circuit unit is disclosed, incorporating the present printed-circuit board. The circuit unit includes an electronic device and the printed-circuit board described above, in which the electronic device is mounted on the printed-circuit board by electrical connection to the plurality of mounting electrodesareas areas. An area, including at least one mounted electronic device, is resin sealed.

By incorporating the printed-circuit board, which has the increased area of contact and adhesive strength between sealing resin and the printed-circuit board, circuit units can be formed with excellent device reliability and high production yield.

In addition, since the resist layer in the printed-circuit board is disposed to frame an outer edge of the sealing region, the sealing resin can be prevented from unduly spreading out from the thus framed region and the resin sealing can be provided within the predetermined region. This helps to reduce the size of the circuit unit.

In addition, the region on the substrate outside the sealing region is encapsulated by the resist layer except the predetermined portion to be exposed mentioned earlier. Thus, circuitry and electrode portions without resin sealing are also protected from deterioration. As a result, the device reliability increases in the circuit units incorporating the printed-circuit boards.

Additional modifications and variations of the present invention are possible in light of the above teachings. It is therefore to be understood that within the scope of the appended claims, the invention may be practiced other than as specifically described herein.

What is claimed as new and desired to be secured by Letters Patent of the United States is:

1. A printed-circuit board, comprising:
   a substrate having a first side and a second side;
   a metal circuit pattern formed on said first side of said substrate;
   at least one mounting electrode formed on said first side of said substrate for electrically connecting at least one electronic component;
   a resist layer of electrically insulating material formed over a surface of said first side of said substrate, said resist layer comprising a first contiguous portion and a second contiguous portion, said first contiguous portion having at least one opening in at least one region corresponding to said at least one mounting electrode, and said second contiguous portion arranged to frame an outer edge of a sealing region; and at least one external connecting terminal provided on an edge portion of said first side of said substrate for connecting to at least one external device, wherein said first contiguous portion of said resist layer is formed solely on an area surrounding said at least one mounting electrode inside said sealing region, said sealing region being resin sealed over the surface of said substrate, and wherein said second contiguous portion of said resist layer is the outermost portion of said resist layer.

2. The printed-circuit board according to claim 1, wherein said resist layer is formed to cover an area over the surface of said substrate other than said sealing region and except a predetermined portion to be exposed, said predetermined portion including at least one area for placing said at least one external connecting terminal.

3. The printed-circuit board according to claim 1, wherein said resist layer is formed to cover an area over the surface of said substrate other than said sealing region and except a predetermined portion to be exposed, said predetermined portion including at least one area for placing said at least one external connecting terminal.

4. The printed-circuit board according to claim 1, wherein said resist layer is formed to frame an outer edge of said sealing region over the surface of said substrate, and to cover an area other than said sealing region and except a predetermined portion to be exposed, said predetermined portion including at least one area for placing said at least one external connecting terminal.

5. The printed-circuit board according to claim 1, further comprising a plurality of mounting electrodes formed on said substrate for electrically connecting at least one electronic component, wherein said resist layer separates each mounting electrode from every other mounting electrode.

6. A circuit unit, comprising:
an electronic device; and
a printed-circuit board;
said printed-circuit board, comprising
a substrate having a first side and a second side;
a metal circuit pattern formed on said first side of said substrate;
at least one mounting electrode formed on said first side of said substrate for electrically connecting at least one electronic component;
a resist layer of electrically insulating material formed over a surface of said first side of said substrate, said resist layer comprising a first contiguous portion and a second contiguous portion, said first contiguous portion having at least one opening in at least one region corresponding to said at least one mounting electrode and being formed solely on an area surrounding said at least one mounting electrode inside a sealing region for use in resin sealing over a surface of said first side of said substrate, and said second contiguous portion arranged to frame an outer edge of a sealing region, wherein said second contiguous portion of said resist layer is the outermost portion of said resist layer; and
at least one external connecting terminal provided on an edge portion of said first side of said substrate for connecting at least one external device, wherein said electronic device is mounted on said printed-circuit board by electrical connection to said at least one mounting electrode, and wherein an area including at least one mounted electronic device is resin sealed.

7. The printed-circuit board according to claim 6, further comprising a plurality of mounting electrodes formed on said substrate for electrically connecting at least one electronic component, wherein said resist layer separates each mounting electrode from every other mounting electrode.

8. A circuit unit, comprising:
an electronic device; and
a printed-circuit board;
said printed-circuit board, comprising
a substrate having a first side and a second side;
a metal circuit pattern formed on said first side of said substrate;
at least one mounting electrode formed on said first side of said substrate for electrically connecting at least one electronic component;
a resist layer of electrically insulating material formed over a surface of said first side of said substrate, said resist layer comprising a first contiguous portion and a second contiguous portion, said first contiguous portion having at least one opening in at least one region corresponding to said at least one mounting electrode, said first contiguous portion of said resist layer being formed solely on an area surrounding said at least one mounting electrode inside a sealing region, said sealing region being resin sealed over a surface of said substrate, said second contiguous portion of said resist layer framing an outer edge of said sealing region; and
at least one external connecting terminal provided on an edge portion of said substrate for connecting at least one external device, wherein said electronic device is mounted on said printed-circuit board by electrical connection to said at least one mounting electrode, wherein an area including at least one area mounting said electronic device is resin sealed, and wherein said second contiguous portion of said resist layer is the outermost portion of said resist layer.

9. The printed-circuit board according to claim 8, further comprising a plurality of mounting electrodes formed on said substrate for electrically connecting at least one electronic component, wherein said resist layer separates each mounting electrode from every other mounting electrode.

10. A printed-circuit board comprising:
a substrate having a circuit pattern formed on a surface thereof;
said circuit pattern having at least one mounting electrode for electrical connection to at least one electronic component;
a resist layer of electrically insulating material formed over said surface and comprising a first contiguous portion and a second contiguous portion, said first contiguous portion arranged within a boundary of said second contiguous portion, said first contiguous portion having at least one opening in at least one region corresponding to said at least one mounting electrode and configured to prevent solder from spreading said second contiguous portion provided on an edge portion of said substrate; and
a sealing region formed of a resin and provided over and in contact with said substrate in regions between said first and second contiguous portions of said resist layer wherein said second contiguous portion arranged to frame an outer edge of the sealing region.

* * * * *